United States Patent [19]

Kolomyski et al.

[11] Patent Number: 5,497,322

[45] Date of Patent: Mar. 5, 1996

[54] MONITORING THE CHARACTERISTICS OF A LOAD DRIVER CONTROLLED BY A MICROCONTROLLER

[75] Inventors: Darrell J. Kolomyski, Chesterfield; John A. Barrs, Clawson, both of Mich.

[73] Assignee: United Technologies Automotive, Inc., Dearborn, Mich.

[21] Appl. No.: 407,562

[22] Filed: Mar. 20, 1995

Related U.S. Application Data

[63] Continuation of Ser. No. 967,464, Oct. 26, 1992.

[51] Int. Cl.$^6$ ................................................. G12B 1/04
[52] U.S. Cl. .......................... 364/424.03; 340/825.06
[58] Field of Search ................................. 324/522, 523; 340/825.06, 825.16, 825.18; 364/424.03, 483

[56] References Cited

U.S. PATENT DOCUMENTS 4,639,609  1/1987  Floyd et al. .

4,884,033  11/1989  McConchie, Sr. .

Primary Examiner—Ellis B. Ramirez
Assistant Examiner—Thomas Peeso

[57] ABSTRACT

Loads, such as power relays controlling wipers, windows and lights are connected to an automobile battery through individual transistor drives that are controlled by a microcontroller. A switch, connected to the microcontroller, is operated to activate each drive. The microcontroller checks the load characteristic when each drive is activated and inactivated. When the load is inactivated, it is part of a resistance network producing a test voltage that is digitally converted and supplied to the microcontroller, which compares the test voltage to a stored voltage to determine if the load is correct. An analog multiplexer is controlled by the microcontroller to select the voltage produced for each load.

28 Claims, 1 Drawing Sheet

5,497,322

MONITORING THE CHARACTERISTICS OF A LOAD DRIVER CONTROLLED BY A MICROCONTROLLER

This is a continuation of copending application Ser. No. 07/967,464 filed on Oct. 26, 1992.

TECHNICAL FIELD

This invention relates to controlling a load, such as windshield wiper motor, and, in particular, monitoring the characteristics of a load driver that is controlled with a microcontroller.

BACKGROUND OF THE INVENTION

In an automobile, there are many powered devices, such as windshield wipers, headlights, dash lights and power windows and door locks, that are individually controlled by switches. Traditionally, these switches simply complete an electric circuit between the automobile battery and the device or a relay connecting the device to the battery. But in many fields, including automobiles, individual controls like that are giving way to controls that use a "microcontroller", a controller structured around a programmed signal processor (an on-board computer). In that environment, the switch is used to generate a control signal that is supplied to the microprocessor, initiating a program call that prompts the processor to execute a routine leading to a command that operates a driver that in turn activates a power relay, connecting battery power to the device. While there are many advantages with this type of control scheme in an automobile, considerably less wiring being one, there are tradeoffs. A microprocessor is a relatively sensitive piece of electrical equipment, one that is not capable of providing high power. This is the reason for the use of a relay driver. The driver, a semiconductor device, must be large enough to handle normal operating loads (coil current), but not too large, to minimize component cost. It makes drive protection particularly important because if the load changes, for example, there is a coil short, excessively high current may damage the drive when the microprocessor activates the drive.

DISCLOSURE OF THE INVENTION

Among the objects of the present invention is to provide a "self-diagnosing" multiple load (device) operating system using a microcontroller, particularly for automobile applications. Another object, as well, is to provide a technique for determining whether a potentially harmful load is connected to a drive and prevent damaging drive operation.

According to the present invention, load characteristics are sensed by a microprocessor or signal processor when a drive is not actuated. If the load is found to be defective for some reason, drive activation is disabled.

According to the invention, a drive consists of a semiconductor circuit in which there is a voltage divider in circuit with the load (e.g. a power relay). The resistance characteristics of the divider changes depending upon the load. Those voltage characteristics are used to determine if the load is correct.

According to the invention, each of the drivers is connected to an analog multiplexer, and, under the control of the microprocessor, the multiplexer selects each of the drives before it is actuated, producing a signal indicating load status. The output from the analog multiplexer, a voltage signal, is processed to produce a digital signal equivalent for load test processing by the signal processor. The magnitude of this signal is used by the signal processor to determine the status of the load by comparing the magnitude with a stored magnitude assigned to the load. If the difference exceeds a stored magnitude for the specific load, the processor prevents (disables) activation of the drive for the load.

According to the present invention, when a drive is activated, the voltage from the divider is compared to a stored value for the load. If the difference between this voltage and the stored value exceeds a stored magnitude, the load is considered defective and the drive is inactivated.

The invention offers a number of features. One particular feature is that by improving drive protection it advances the use of low power, less expensive drives. Other objects, benefits and features of the invention will be apparent to one skilled in the art from the following discussion of the invention.

BRIEF DESCRIPTION OF THE DRAWING

The drawing comprises a functional block diagram of a system embodying the present invention for controlling exemplary equipment, wipers, headlights and power windows, from associated control switches.

BEST MODE FOR CARRYING OUT THE INVENTION

Figure 1:
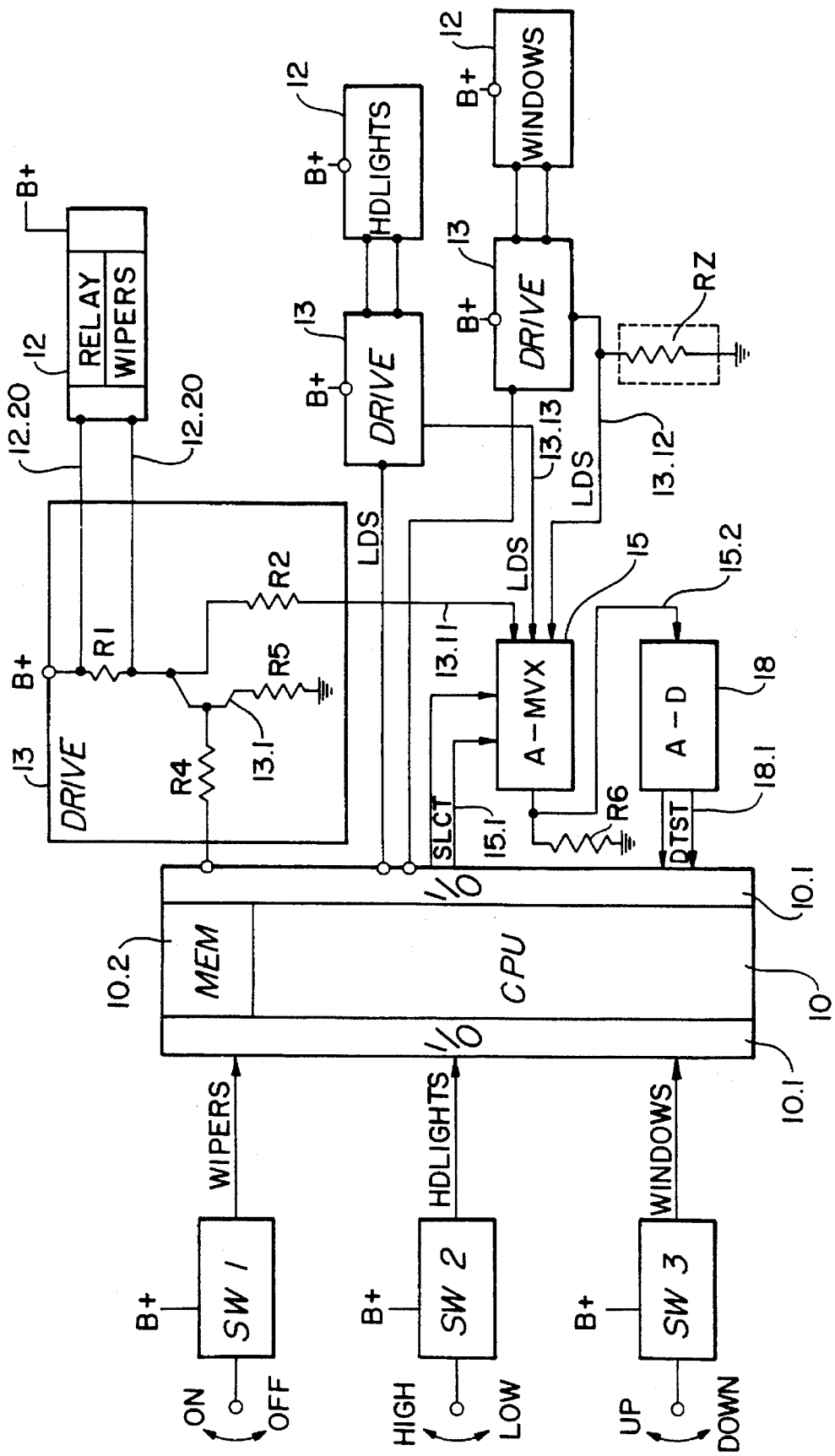

In the drawing, there are three switches SW1, SW2 and SW3, which may be any type of switch, such as toggle, rotating, push-pull or rocker. Each individually controls a drive (load) 12, such as wipers, headlights and power windows. Each drive 12 is assumed to include a power relay that connects the drive or "load" to the battery B+. However, in place of the relay, a solid state switch or variable drive (e.g. light dimmer) may be used for some drives, such as dash lights and cabin lights. The switches are connected to B+, and when operated provide a signal (high/low or low/high depending on the switch connection to B+) to an input/output section 10.1 of the controller, which includes a CPU (central processing unit or signal processor) 10.3 and a memory (MEM) 10.2. for storing dam and CPU operating instructions. The I/O section 10.1 also connects the CPU to three drivers 13. Each driver has the internal structure specifically revealed for driver 13, although it should be appreciated that resistor values may be different for different loads. Driver 13 (and each driver) contains an NPN transistor 13.1 that draws current through a resistor R1 from the B+ supply. Load 12 (a wiper motor in the case of drive 13) is connected in parallel with a resistor R1. The transistor supplies current to the relay and the relay connects the wiper motor to B+. A resistor R2 connects the collector of transistor 13.1 to one input on an A-MUX 15, providing a test signal LDS on line 13.11. Base current to the base of transistor 13.1 is supplied from the I/O 10.1 through a resistor R4. A resistor R5 connects the emitter of transistor 13.1 to ground. The A-MUX 15 is connected via a control line 15.1 to the I/O 10.1. The A-MUX produces an analog output TST on output line 15.2, which is supplied to an A/D converter 18, which produces a digital output signal DTST on the line 18.1 to the input/output 10.1. The output on the line 15.2 may be either one of three signals generically named signals LDS that appear on the lines 13.11, 13.12, 13.13, each from a drive 12. On the line 15.1, the A-MUX 15 receives a select signal SLCT from the processor 10, causing it to select one line 13.11, 13.12, 13.13. When a line is selected, the voltage on line 15.2 becomes the A-MUX output (ignoring any drops in the A-MUX). The A/D converter 18 converts this into a digital signal on line 18.1, manifesting the voltage level of LDS. The CPU processes that signal to determine whether the load is correct. At this point, it should be considered that the effects of the AMUX 15 voltage drop may be minimized with an alternative circuit arrangement. The sole resistor R6 may be replaced with a resistor Rz on each line 13.11, 13.12, 13.13 before the A-MUX (shown by way of example on 13.12.) With this alternative arrangement, the A-MUX would directly apply the voltage at the junction of Rz and R2 for a selected drive to the line 15.2 in response to the SLCT signal.

In the embodiment that is shown, however, the A-MUX selection of any one of the drives, puts the resistor R2 (in each drive) individually in series with one resistor R6, which is connected to ground, the combination creating a voltage divider between B+ and ground when the transistor is off. The voltage on line 15.2 becomes the voltage at the junctions between resistors R2 and R6. The voltage on line 15.2 actually is a function of the voltage divider created by the parallel resistance of R1 and the load, e.g. a relay coil (in load 12). The voltage on line 15.2 is digitally generated on line 18.1 and the CPU compares the signal DTST with a stored value (in the memory 10.2). The stored value, it should be considered, is specific for the specific load (e.g. wiper relay or dimmer) in as much as different loads will have different resistances. Assuming a relay, if the relay coil is open, the resistance will be high producing a smaller voltage on lines 18.1. If the relay is shorted, on the other hand, the voltage will be higher. In this way, the characteristics of each load can be individually tested. (The same would be true if a load is directly connected to drive.) If the load so sensed is incorrect, the CPU will set a processing flag, disabling production of a drive signal to the transistor 13.1 that it would otherwise produce to provide power to the load.

The system can also diagnose the load and drive characteristics when the device is operating. With the transistor 13.1 conducting, the level of signal LDS will drop as function of drive current and load current. This voltage is sensed by instructing the A-MUX to connect resistor R2 and R6 while the drives are conducting. The CPU then compares the voltage with a stored (assigned) voltage level (stored for conditions of when each driver is operated) to determine load condition (shorted or open power relay, stalled motor) and drive condition. If improper operation is determined, transistor base drive is removed before excessive transistor heat dissipation takes place. Having the capability to initiate test routines many times per second, depending on processor speed and program complexity, the signal processor can undertake this test on a cyclical basis entering a test routine at programmed intervals without affecting drive operation.

If a microcontroller such as the controller 10 is used to control only one device, the A-MUX is not needed. Instead, resistor R2 and R6 can be directly connected together. In an embodiment taking that approach, the voltage between the two resistors can be provided directly to the A/D converter. As noted previously, if A-MUX drop is a problem, the voltage dividers can be permanently included in each drive 13, by putting a resistor Rz to ground on each line 13.11, 13.12, 13.13, a configuration that minimizes the effects of A-MUX voltage drops but increases the number of resistors. The A-MUX would connect each resistor R6 to ground, with signal LDS being the voltage between R2 and R6.

With the benefit of the foregoing explanation, one skilled in the an may be able to make other modifications and variations to the invention in whole or in pan without departing from the true scope and spirit of the invention described in the claims the follow.

We claim:

1. A control system comprising a DC power source, a load, a drive, and a control for activating the drive to provide power to the load, characterized in that:

the drive comprises means in connection with said load and the power source for producing a load test signal with a magnitude that is a function of load resistance;

means for converting said load test voltage into a digital signal equivalent supplied to the control; and said control comprises signal processing means for receiving said digital signal before said drive is activated, for comparing said digital signal to a stored signal for said load and for preventing activation of said drive if the difference between said digital signal and said stored signal exceeds a stored magnitude.

2. A control system according to claim 1, characterized in that said means in connection with said load comprises a first resistor in parallel with said load and in series with a second resistor in series with a third resistor, said first second and third resistors carrying current from the power source.

3. A control system according to claim 2, characterized in that the drive comprises a transistor supplied with power from the source through said first resistor.

4. A control system according to claim 1 or 3, characterized in that said signal processor comprises means for inactivating a drive if the difference between said load signal and a stored value exceeds a stored level and disabling subsequent activation of said drive.

5. A control system according to claim 4, characterized in that said means in connection with a load comprises a first resistor in parallel with said load and in series with a second resistor in series with a third resistor, said first second and third resistors carrying current from the power source.

6. A control system according to claims 4 or 5, characterized in that said signal processor comprises means for inactivating a drive if the difference between said load signal and a stored value exceeds a stored level and for disabling subsequent activation of said drive.

7. A control system comprising a DC power source, first and second loads, a drive for each load, and a control for activating a drive to provide power to the load, characterized in that:

said first and second drives each comprise means in connection with a load connected to the drive and connected to the power source for producing a load test signal with a magnitude that is a function of load resistance;

means for converting said load test voltage into a digital signal equivalent supplied to the control;

means for selecting one load test signal from load test signals produced for each of the drives and supplying said one signal to said means for converting in response to a drive select command; and said control comprises signal processing means for providing said drive select command; for receiving said digital signal when said drive is inactivated, for comparing said digital signal to a stored signal for said load and for preventing activation of said drive if the difference between said digital signal and said stored signal exceeds a stored magnitude.

8. A control system according to claim 7, characterized in that the drive comprises a transistor supplied with power from the source through said first resistor.

9. A control system for controlling a load, the load having an impedance, an operating minimum and an operating maximum, said control system comprising:

a driver for driving the load in response to a control signal, and for generating a driver test signal in response to a monitor signal, said driver test signal having a magnitude corresponding with the impedance, said monitor signal being below said operating minimum; and a controller for generating said monitor signal before generating said control signal, and for inactivating said driver when said driver test signal is greater than the operating maximum.

10. The control system of claim 9, further comprising:

an analog to digital converter for converting said driver test signal into a digitized driver test signal.

11. The control system of claim 10, wherein the operating maximum is digitally stored in a memory such that said digitized driver test signal is compared with said digitally stored operating maximum.

12. The control system of claim 9, wherein said driver is coupled with the load by a resistor in parallel with the load, and said resistor is coupled with said controller by a transistor.

13. The control system of claim 9, wherein said controller further generates a diagnostic signal when said driver test signal is less than the operating minimum.

14. The control system of claim 9, wherein said controller further inactivates said driver when said driver test signal is less than the operating minimum.

15. A control system for controlling a first and a second load, each of the first and second loads having an impedance, an operating minimum and an operating maximum, said control system comprising:

a first driver for driving the first load in response to a first control signal, and for generating a first driver test signal in response to a first monitor signal, said first driver test signal having a magnitude corresponding with the impedance of the first load, said first monitor signal being below said operating minimum of the first load;

a second driver for driving the second load in response to a second control signal, and for generating a second driver test signal in response to a second monitor signal, said second driver test signal having a magnitude corresponding with the impedance of the second load, said second monitor signal being below said operating minimum of the second load;

a multiplexer for receiving said first and said second driver test signals, and for generating a selected driver test signal in response to a select signal, said selected signal corresponding with a selected driver of said first and second drivers, said selected driver corresponding with a selected load of the first and second loads; and a controller for generating said first monitor signal before generating said first control signal, for generating said second monitor signal before generating said second control signal, for generating said select signal, and for inactivating said selected driver when said selected driver test signal is greater than the operating maximum of the selected load.

16. The control system of claim 15, further comprising:

an analog to digital converter for converting said selected driver test signal into a selected digitized driver test signal.

17. The control system of claim 16, wherein the operating maximum of the selected load is digitally stored in a memory such that said selected digitized driver test signal is compared with said digitally stored operating maximum of the selected load.

18. The control system of claim 15, further comprising:

an analog to digital converter for digitizing said first and said second driver test signals.

19. The control system of claim 18, wherein the operating maximum of the selected load is digitally stored in a memory such that said selected driver test signal is compared with said digitally stored operating maximum of the selected load.

20. The control system of claim 15, wherein said selected driver is coupled with the selected load by a resistor in parallel with the selected load, and said resistor is coupled with said microcontroller by a transistor.

21. The control system of claim 15, wherein said controller inactivates said driver by failing to generate said control signal.

22. The control system of claim 15, wherein at least one of the first and second loads comprises at least one of a wiper motor, a headlight, and a power window motor.

23. The control system of claim 15, further comprising a first and a second switch for transmitting a first and a second enabling signal to said controller, said first enabling signal corresponding with said first control signal and said second enabling signal corresponding with said second control signal.

24. The control system of claim 15, wherein said controller further generates a diagnostic signal when said selected driver test signal is less than the operating minimum of the selected load.

25. The control system of claim 15, wherein said controller further inactivates said selected driver when said selected driver test signal is less than the operating minimum of the selected load.

26. A control system for controlling a load, the load having an impedance, an operating minimum and an operating maximum, said control system comprising:

a driver for driving the load in response to a control signal, and for generating a driver test signal in response to a monitor signal, said driver test signal having a magnitude corresponding with the impedance, said monitor signal being below the operating minimum; and a controller for generating said monitor signal before generating said control signal, for generating a diagnostic signal when said driver test signal is less than the operating minimum, and for inactivating said driver when said driver test signal is greater than the operating maximum.

27. The control system of claim 26, further comprising:

an analog to digital converter for converting said driver test signal into a digitized driver test signal.

28. The control system of claim 27, wherein the operating minimum and the operating maximum are digitally stored in a memory such that said digitized driver test signal is compared with both said digitally stored operating minimum and said digitally stored operating maximum.

* * * * *